United States Patent
Wu et al.

(10) Patent No.: US 12,292,674 B2
(45) Date of Patent: May 6, 2025

(54) HEAT DISSIPATION MODULE AND PROJECTION DEVICE

(71) Applicant: Coretronic Corporation, Hsin-Chu (TW)

(72) Inventors: Pei-Rong Wu, Hsin-Chu (TW); Shi-Wen Lin, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 538 days.

(21) Appl. No.: 17/534,416

(22) Filed: Nov. 23, 2021

(65) Prior Publication Data

US 2022/0171263 A1      Jun. 2, 2022

(30) Foreign Application Priority Data

Nov. 30, 2020   (CN) .......................... 202022824630.4

(51) Int. Cl.
   *G03B 21/16*      (2006.01)
   *G02B 6/42*       (2006.01)
   *H05K 7/20*       (2006.01)

(52) U.S. Cl.
   CPC ........... *G03B 21/16* (2013.01); *G02B 6/4269* (2013.01); *H05K 7/20136* (2013.01); *H05K 7/20263* (2013.01); *H05K 7/20272* (2013.01); *H05K 7/2039* (2013.01)

(58) Field of Classification Search
   CPC .. G03B 21/16; G03B 21/2033; G02B 6/4269; H05K 7/20136; H05K 7/20263; H05K 7/20272; H05K 7/2039
   USPC .......................................................... 353/54
   See application file for complete search history.

(56) References Cited

U.S. PATENT DOCUMENTS

| | | | |
|---|---|---|---|
| 9,128,361 B2 | 9/2015 | Yanagisawa et al. | |
| 2010/0195280 A1* | 8/2010 | Huang | G06F 1/203 361/696 |
| 2010/0265468 A1* | 10/2010 | Lin | G03B 21/16 353/57 |
| 2014/0184050 A1* | 7/2014 | Mizuta | F21V 29/763 313/45 |
| 2019/0049103 A1* | 2/2019 | Jiang | F21V 29/763 |
| 2019/0324356 A1* | 10/2019 | Chen | H04N 9/3144 |
| 2021/0033952 A1* | 2/2021 | Dai | G03B 21/16 |

FOREIGN PATENT DOCUMENTS

| | | | | |
|---|---|---|---|---|
| CN | 107479307 A | * | 12/2017 | ............. G03B 21/16 |
| CN | 109143742 | | 1/2019 | |
| CN | 210720996 U | * | 6/2020 | ............. G03B 21/16 |

* cited by examiner

*Primary Examiner* — Magda Cruz
(74) *Attorney, Agent, or Firm* — JCIPRNET

(57) ABSTRACT

A heat dissipation module, configured for heat dissipation of at least one first heat source and at least one second heat source, and including a first heat sink, a second heat sink, a first pipe, and a second pipe, is provided. The first heat sink and the first heat source are connected to each other through the first pipe to form a first loop, so that a liquid medium flows through the first heat sink for heat exchange and then flows to the first heat source for circulating heat dissipation. The second heat sink and the second heat source are connected to each other through the second pipe to form a second loop, so that the liquid medium flows through the second heat sink for heat exchange and then flows to the second heat source for circulating heat dissipation. A projection device, including the heat dissipation module, is also provided.

18 Claims, 4 Drawing Sheets

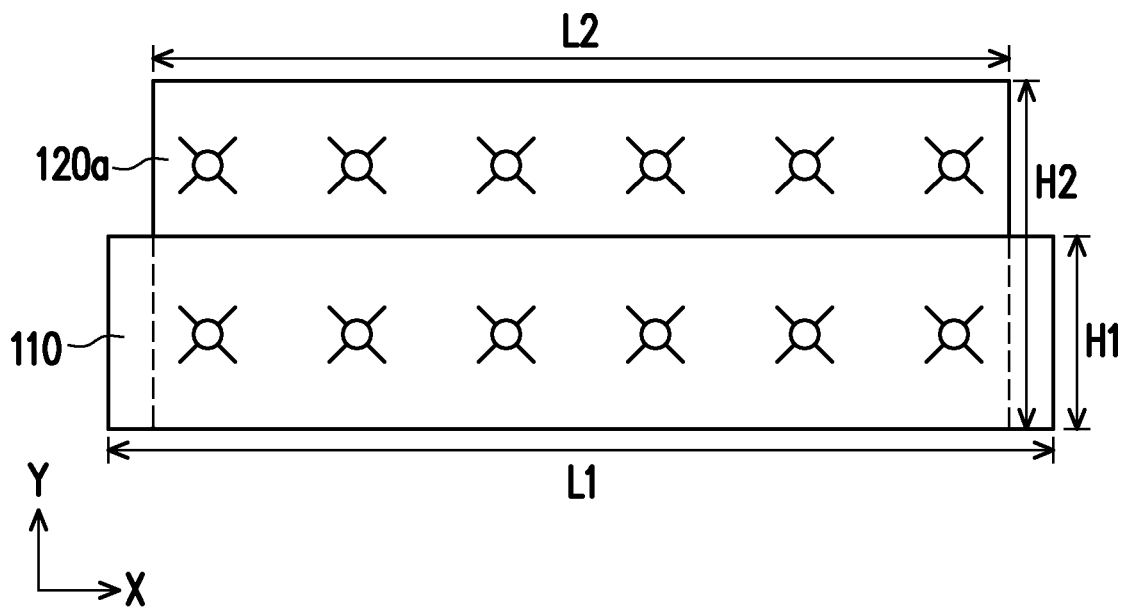
FIG. 1B
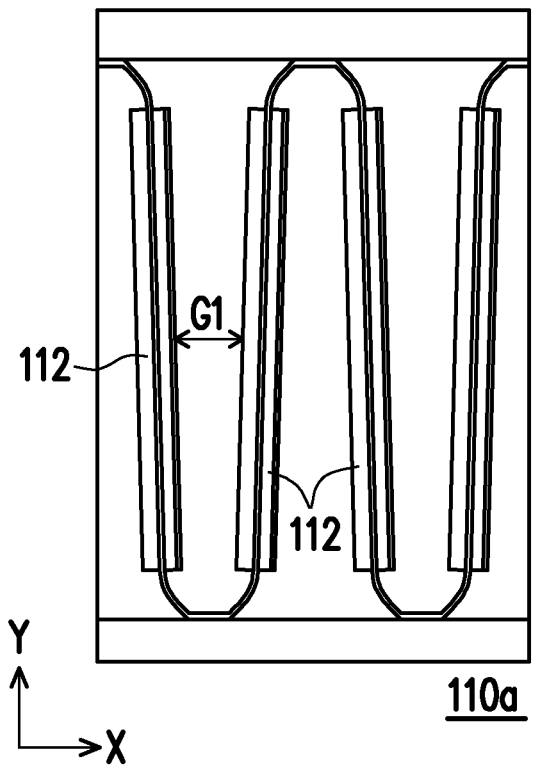 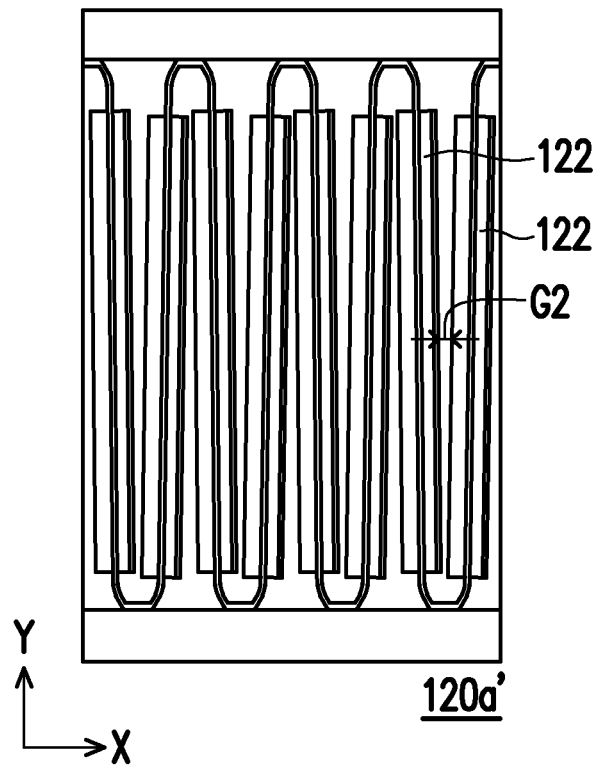
FIG. 1C          FIG. 1D

HEAT DISSIPATION MODULE AND PROJECTION DEVICE

CROSS-REFERENCE TO RELATED APPLICATION

This application claims the priority benefit of China application serial no. 202022824630.4, filed on Nov. 30, 2020. The entirety of the above-mentioned patent application is hereby incorporated by reference herein and made a part of this specification.

BACKGROUND

Technical Field

The invention relates to a heat dissipation module and a projection device, and particularly relates to a heat dissipation module with a better heat dissipation effect and a projection device using the heat dissipation module.

Description of Related Art

In a solid-state light source projection system, an air cooling method is generally used to dissipate heat of a light source. Regarding a current design of air cooling heat dissipation, a thermal resistance thereof is about 0.12° C./W. If heat increases, when the thermal resistance drops below 0.1° C./W, thermoelectric cooling (TEC) or a liquid cooling technology must be used for heat dissipation. The liquid cooling has an advantage of low thermal resistance and has better heat exchange efficiency than air cooling. When there are space constraints and low thermal resistance requirements, the liquid cooling is generally selected for the design of heat dissipation.

Generally, in a heat dissipation module of a single liquid cooling loop, when a temperature of a heat source rises or a number of heat sources continues to increase, if an area of a heat sink remains the same, a liquid temperature at an outlet of the heat sink will be too high. At this time, even though a component with the lowest operating temperature is placed on a first group of liquid-cooling plates for cooling, there will still be situations where the liquid temperature is higher than the operating temperature of the component. In order to make the components with lower operating temperatures to also meet heat dissipation requirements, in addition to increasing a number of fans and improving performance of driving motors, a volume of the heat sink may also be increased. However, the above approaches may cause the liquid cooling system to become larger and result in a poor overall space utilization rate. Furthermore, in order to improve the space utilization rate, the heat sink is split and respectively placed upstream and downstream of the system, but after the air passes through the upstream heat sink of the system, an air temperature in the system has risen, and when the air with the higher temperature is used to cool the downstream heat sink of the system, and the cooling effect is not good. In addition, as a total heat of the system increases and all components are on a same liquid circulation, the liquid temperature at the outlet of the heat sink is still increased, and it is impossible to provide cooling liquid with a lower temperature for the components with lower operating temperatures.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The invention is directed to a heat dissipation module, which has better heat dissipation efficiency.

The invention is directed to a projection device including the aforementioned heat dissipation module, in which under a condition that a number of fans is not increased, a cooling area is increased and a rotation speed of the fans is reduced, thereby reducing system noise.

Other objects and advantages of the invention may be further illustrated by the technical features broadly embodied and described as follows.

In order to achieve one or a portion of or all of the objects or other objects, an embodiment of the invention provides a heat dissipation module for heat dissipation of at least one first heat source and at least one second heat source of a projection device. The heat dissipation module includes a first heat sink, a second heat sink, a first pipe, and a second pipe. The first heat sink and the first heat source are connected to each other through the first pipe to form a first loop, so that a liquid medium flows through the first heat sink for heat exchange and then flows to the first heat source for circulating heat dissipation. The second heat sink and the second heat source are connected to each other through the second pipe to form a second loop, so that the liquid medium flows through the second heat sink for heat exchange and then flows to the second heat source for circulating heat dissipation.

In order to achieve one or a portion of or all of the objects or other objects, an embodiment of the invention provides a projection device including a casing, a projection lens, at least one first heat source, at least one second heat source, and the heat dissipation module of any of the above embodiments. The projection lens is disposed through the casing. The first heat source, the second heat source and the heat dissipation module are arranged in the casing.

Based on the above description, the embodiments of the invention have at least one of the following advantages or effects. In the design of the heat dissipation module of the invention, the first heat sink and the first heat source form the first loop through the first pipe, the second heat sink and the second heat source form the second circuit through the second pipe, and the liquid medium in the pipes flows through the heat sinks for heat exchange and then flows to the heat sources for circulating heat dissipation. In other words, by using two sets of independent liquid cooling loops to respectively dissipate heat of the first heat source and the second heat source with different operating temperatures, the heat dissipation module of the invention may have better heat dissipation efficiency. In addition, the projection device using the heat dissipation module of the invention may have increased heat dissipation area without increasing a number of fans, and may reduce a rotation speed of the fans, thereby reducing system noise.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1B is a side view schematic diagram of a first heat sink and a second heat sink of a heat dissipation module in FIG. 1A.

FIG. 1C and FIG. 1D are respectively partial enlarged views of the first heat sink and the second heat sink.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
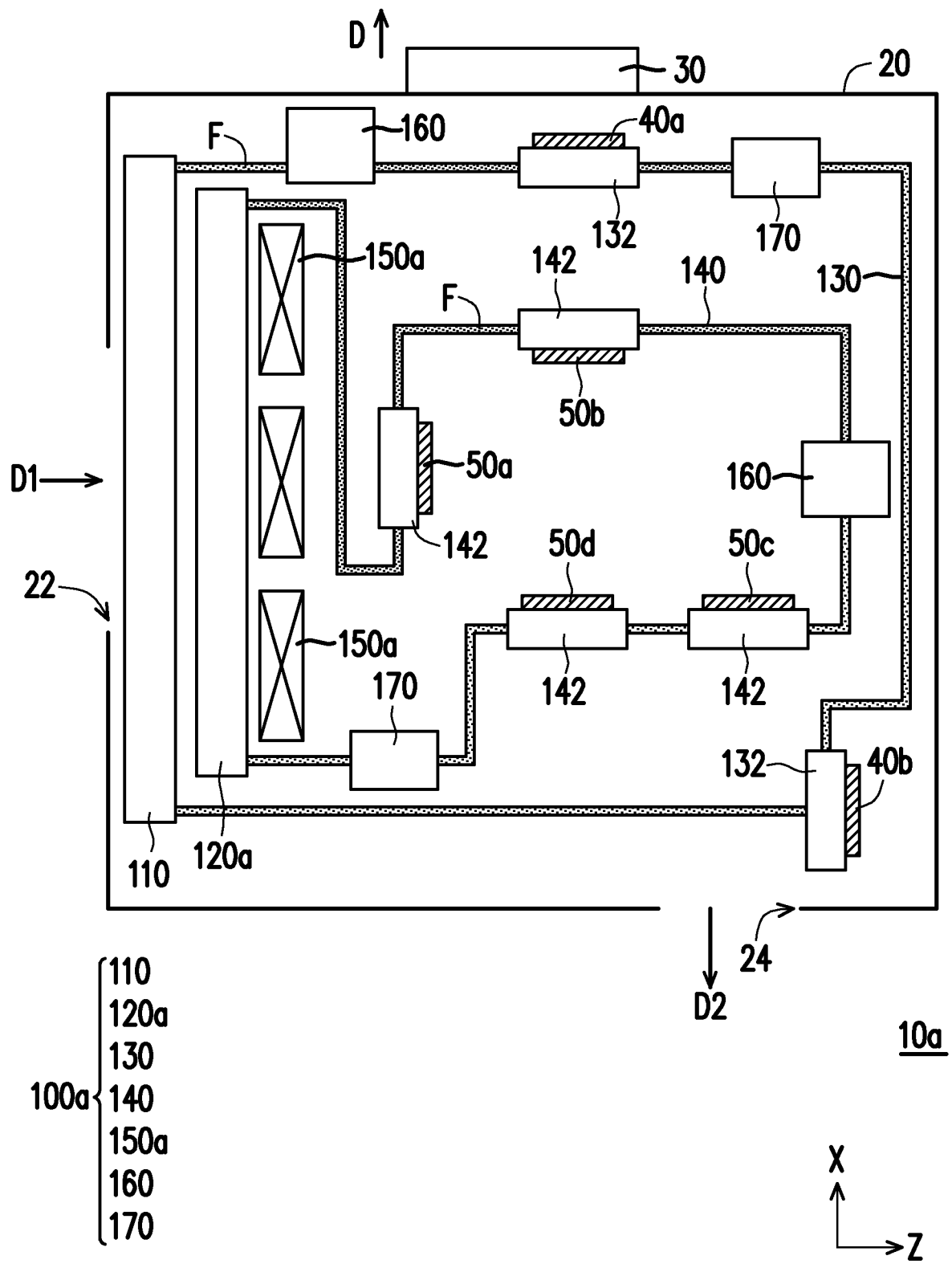
FIG. 1A is a schematic diagram of a projection device according to an embodiment of the invention.

FIG. 1A is a schematic diagram of a projection device according to an embodiment of the invention. FIG. 1B is a side view schematic diagram of a first heat sink and a second heat sink of a heat dissipation module in FIG. 1A. Referring to FIG. 1A first, in the embodiment, the projection device 10a includes a casing 20, a projection lens 30, at least one first heat source (two first heat sources 40a, 40b are schematically illustrated), at least one second heat source (four second heat sources 50a, 50b, 50c, 50d are schematically illustrated), and a heat dissipation module 100a. The projection lens 30 is disposed through the casing 20, and the first heat sources 40a, 40b, the second heat sources 50a, 50b, 50c, 50d and the heat dissipation module 100a are disposed in the casing 20.

Further, the heat dissipation module 100a of the embodiment includes a first heat sink 110, a second heat sink 120a, a first pipe 130, and a second pipe 140. The first heat sink 110 and the first heat sources 40a, 40b are connected to each other through the first pipe 130 to form a first loop, so that a liquid medium F flows through the first heat sink 110 for heat exchange and then flows to the first heat sources 40a and 40b for circulating heat dissipation. Namely, the liquid medium F is filled in the first pipe 130 and flows in the first pipe 130, where the liquid medium F absorbs the heat of the first heat sources 40a and 40b, and then flows into the first heat sink 110, and the liquid medium F flowing into the first heat sink 110 conducts heat exchange with the first heat sink 110, and then flows to the first heat sources 40a and 40b for circulating heat dissipation.

The second heat sink 120a and the second heat sources 50a, 50b, 50c, 50d are connected to each other through the second pipe 140 to form a second loop, so that the liquid medium F flows through the second heat sink 120a for heat exchange and then flows to the second heat sources 50a, 50b, 50c and 50d for circulating heat dissipation. Namely, the liquid medium F is filled in the second pipe 140 and flows in the second pipe 140, where the liquid medium F absorbs the heat of the second heat sources 50a, 50b, 50c and 50d, and then flows into the second heat sink 120a, and the liquid medium F flowing into the second heat sink 120a conducts heat exchange with the second heat sink 120a, and then flows to the second heat sources 50a, 50b, 50c and 50d for circulating heat dissipation.

The liquid medium F in the first pipe 130 and the second pipe 140 may be the same, and the liquid medium F is, for example, liquid. In another embodiment that is not illustrated, the liquid medium F in the first pipe 130 and the second pipe 140 may also be different, which is still within a scope of the invention.

Particularly, an operating temperature of the first heat sources 40a and 40b of the embodiment is different from an operating temperature of the second heat sources 50a, 50b, 50c and 50d. In the embodiment, the operating temperature of the first heat sources 40a, 40b is lower than the operating temperature of the second heat sources 50a, 50b, 50c and 50d. To be specific, the first heat sources 40a and 40b are, for example, red light sources of the projection device 10a. For the requirement of brightness, a temperature resistance is below 45° C., so that the first heat sources 40a and 40b are designed to have a first operating temperature, and the first operating temperature is 35° C. The second heat sources 50a, 50b, 50c and 50d are, for example, blue light sources of the projection device 10a. For the requirement of brightness, the temperature resistance is below 65° C., so that the second heat sources 50a, 50b, 50c and 50d are designed to have a second operating temperature, and the second operating temperature is 55° C.

In another embodiment, under the condition that the operating temperature of the first heat sources 40a and 40b is less than the operating temperature of the second heat sources 50a, 50b, 50c and 50d, the first heat sources 40a and 40b are, for example, but not limited to, a red light source and a light valve module of the projection device 10a, and the second heat sources 50a, 50b, 50c and 50d are, for example, but not limited to, two sets of blue light sources, a motor module and a circuit module of the projection device 10a.

In other words, the invention provides two liquid cooling heat dissipation loops, where a total heat amount of the first heat sources is lower than a total heat amount of the second heat sources, i.e., the first loop dissipates heat of the first heat sources with a lower operating temperature, and the second loop dissipates heat of the second heat sources with a higher operating temperature. Under such design, after the heat dissipation module and the projection device are operated (for example, for 10 minutes), the first heat sources have the first operating temperature and the second heat sources have the second operating temperature, and the first operating temperature is low than the second operating temperature.

In addition, a temperature increase rate of the liquid medium F in the first pipe 130 is lower than a temperature increase rate of the liquid medium F in the second pipe 140. The liquid medium F in the first pipe 130 has a first temperature, and the liquid medium F in the second pipe 140 has a second temperature, and the first temperature is less than the second temperature.

Moreover, the casing 20 of the embodiment has an air inlet 22. Since a liquid temperature required by the first loop is relatively low, the first heat sink 110 may be arranged corresponding to the air inlet 22 for cooling at a relatively low air temperature. The first heat sink 110 and the second heat sink 120a are arranged in parallel, and relative to a position of the first heat sink 110, the second heat sink 120a is located at a relatively downstream position in the system of the overall projection device 10a. Since the temperature of the air is increased after passing through the first heat sink 110, the heat dissipation efficiency of the second heat sink 120a is poor, and a liquid temperature at an outlet is also higher. However, the second heat sources 50a, 50b, 50c and 50d connected in series with the second heat sink 120a have a higher operating temperature, so the second loop still meets a heat dissipation requirement and has a better heat dissipation effect.

Referring to FIG. 1A again, the casing 20 further has an air outlet 24, where an airflow direction D1 of the air inlet 22 is perpendicular to a projection direction D of the projection lens 30, and an airflow direction D2 of the air outlet 24 is parallel to the projection direction D of the projection lens 30, but the invention is not limited thereto.

It should be noted that in the embodiment, sizes or structures of the first heat sink 110 and the second heat sink 120a may be freely adjusted according to the required liquid temperature and the amount of dissipated heat, so that the heat dissipation effect of the first heat sink 110 may be higher than that of the second heat sink 120a.

As shown in FIG. 1A and FIG. 1B, in the embodiment, in a flowing direction of the heat dissipation airflow, i.e., in a direction perpendicular to an arrangement direction of a plurality of heat dissipation fins of the first/second heat sinks 110 and 120a, an area of the first heat sink 110 is larger than an area of the second heat sink 120a, and a first height H1 of the first heat sink 110 is smaller than a second height H2 of the second heat sink 120a, and in a direction parallel to the arrangement direction of the heat dissipation fins of the first/second heat sinks 110 and 120a, a first length L1 of the first heat sink of 110 is greater than a second length L2 of the second heat sink 120a, where the arrangement direction of the heat dissipation fins of the first/second heat sink 110 and 120a and the length direction are an X direction, the height direction is a Y direction, the flowing direction of the heat dissipation airflow is a Z direction, and the X, Y, and Z directions are perpendicular to each other.

A first area of the first heat sink 110 is smaller than a second area of the second heat sink 120a, i.e., a heat dissipation area of the first heat sink 110 is smaller than a heat dissipation area of the second heat sink 120a.

In other words, the embodiment is not limited to the heat dissipation effects of the first heat sink and the second heat sink, and a designer may determine the heat dissipation area of the heat sink according to a thermal resistance of the heat source to be cooled, where the heat source with a small thermal resistance may be used in combination with the heat sink with a smaller heat dissipation area, and the heat source with a larger thermal resistance may be used in combination with the heat sink with a larger heat dissipation area. The thermal resistance is related to a total heat amount of the heat source corresponding to the heat sink, a temperature of the heat dissipating airflow before entering each heat sink, and an average temperature of the liquid inlet and outlet of the heat sink, where the average temperature of the liquid inlet and outlet and the required operating temperature of the heat source.

In another embodiment, referring to FIG. 1C and FIG. 1D, the first heat sink 110a includes a plurality of first heat dissipation fins 112, and the second heat sink 120a' includes a plurality of second heat dissipation fins 122. If the heat dissipation areas of the first heat sink 110a and the second heat sink 120a' are the same, i.e., when the height and the length of the first heat sink 110a and the height and the length of the second heat sink 120a' are the same, a first gap G1 between the first heat dissipation fins 112 may be greater than a second gap G2 between the second heat dissipation fins 122. In the embodiment, the thermal resistance is changed by changing the gap.

Namely, in the case of the same area, the heat dissipation area may be determined by controlling the gap between the heat dissipation fins. In brief, the heat dissipation area of the heat sink may be determined according to the operating temperature of the heat source to be cooled, where adjustable parameters of the heat sink are the length, height and the gap between the fins, according to the adjustment of the above parameters, the heat sinks with different heat dissipation areas may be obtained.

In addition, referring to FIG. 1A, the heat dissipation module 100a of the embodiment further includes at least one fan (three fans 150a are schematically illustrated), where the second heat sink 120a is disposed between the first heat sink 110 and the fans 150a. The heat dissipation module 100a may further include two driving elements 160, where the driving elements 160 are respectively connected to the first pipe 130 and the second pipe 140, and the liquid medium F is driven by the driving element 160 to circulate in the first pipe 130 and the second pipe 140.

In another embodiment that is not shown, a number of the driving element 160 may be only one, which is connected to the first pipe 130 or the second pipe 140, so that the liquid medium F is driven by the driving element 160 to circulate in the first pipe 130 or the second pipe 140, which still belongs to the scope of the invention. The driving element 160 is, for example, a pump, but the invention is not limited thereto.

Moreover, the heat dissipation module 100a of the embodiment may further include two tanks 170, which are respectively connected to the first pipe 130 and the second pipe 140 to accommodate the liquid medium F. The liquid medium F in the tanks 170 is by the driving elements 160 to circulate in the first pipe 130 and the second pipe 140. In another embodiment that is not shown, a number of the tank 170 may be only one, which is connected to the first pipe 130 or the second pipe 140, and the liquid medium F in the tank 170 is driven by the driving element 160 to circulate in the first pipe 130 or the second pipe 140, which still belongs to the scope of the invention.

In order to improve the heat dissipation efficiency, at least a part of the first pipe 130 in the embodiment is heat sink accommodating slots 132, and at least a part of the second pipe 140 is heat sink accommodating slots 142. The first heat sources 40a, 40b and the second heat sources 50a, 50b, 50c and 50d respectively contact the heat sink accommodating slots 132, 142, and the liquid medium F flows into the heat sink accommodating slots 132, 142 for heat dissipation. The heat sink accommodating slots 132 and 142 may be respectively regarded as a kind of cold plate.

In brief, the heat dissipation module 100a of the embodiment adopts two independent liquid cooling loops to respectively dissipate the heat of the first heat sources 40a, 40b and the second heat sources 50a, 50b, 50c and 50d with different operating temperatures, which achieves a better heat dissipation effect. Namely, the heat dissipation module 100a of the embodiment may be effectively configured with liquid cooling according to a temperature resistance level, so that the heat sources may have a better heat dissipation effect to achieve more effective utilization of resources. In addition, the projection device 10a using the heat dissipation module 100a of the embodiment adopts a liquid cooling heat dissipation system, and since the heat dissipation module 100a is effectively configured with the heat sources, the heat dissipation area may be increased without increasing the number of fans, and under the condition that the heat dissipation efficiency is improved, a fan speed is reduced to reduce system noise.

It should be noticed that reference numbers of the components and a part of contents of the aforementioned embodiment are also used in the following embodiment, wherein the same reference numbers denote the same or like components, and descriptions of the same technical contents are omitted. The aforementioned embodiment may be referred for descriptions of the omitted parts, and detailed descriptions thereof are not repeated in the following embodiment.

Figure 2:
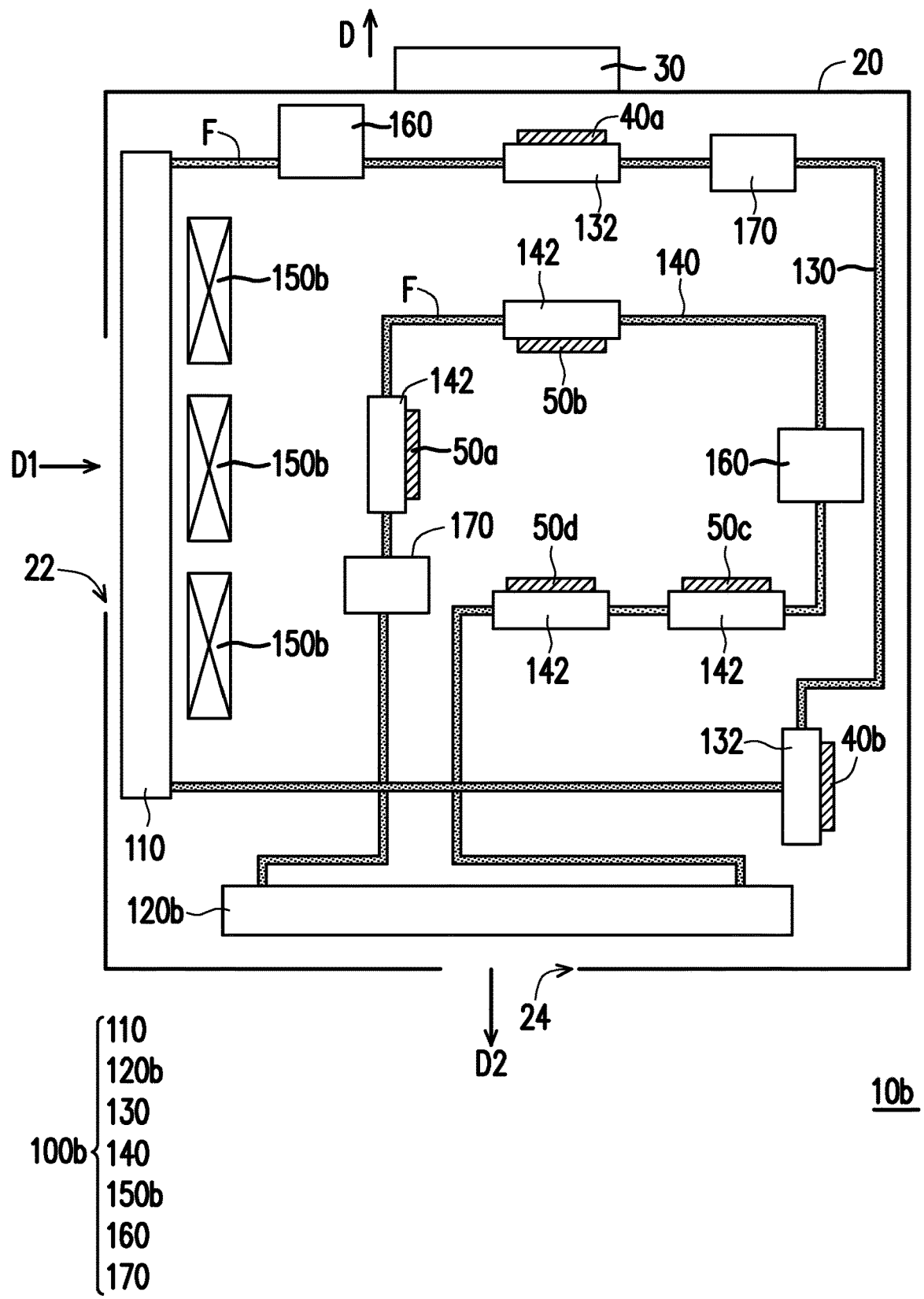
FIG. 2 is a schematic diagram of a projection device according to another embodiment of the invention.

FIG. 2 is a schematic diagram of a projection device according to another embodiment of the invention. Referring to FIG. 1A and FIG. 2 at the same time, the projection device 10b of the embodiment is similar to the projection device 10a of the aforementioned embodiment. A difference between the two projection devices 10a and 10b is that: in the embodiment, the fans 150b of the heat dissipation module 100b are arranged on one side of the first heat sink 110 relatively far away from the air inlet 22, and the second heat sink 120b is disposed corresponding to the air outlet 24. Namely, the fans 150b are arranged on one side of the first heat sink 110, the first heat sink 110 and the second heat sink 120b are arranged vertically, and the fans 150b are arranged between the first heat sink 110 and the second heat sink 120b.

Figure 3:
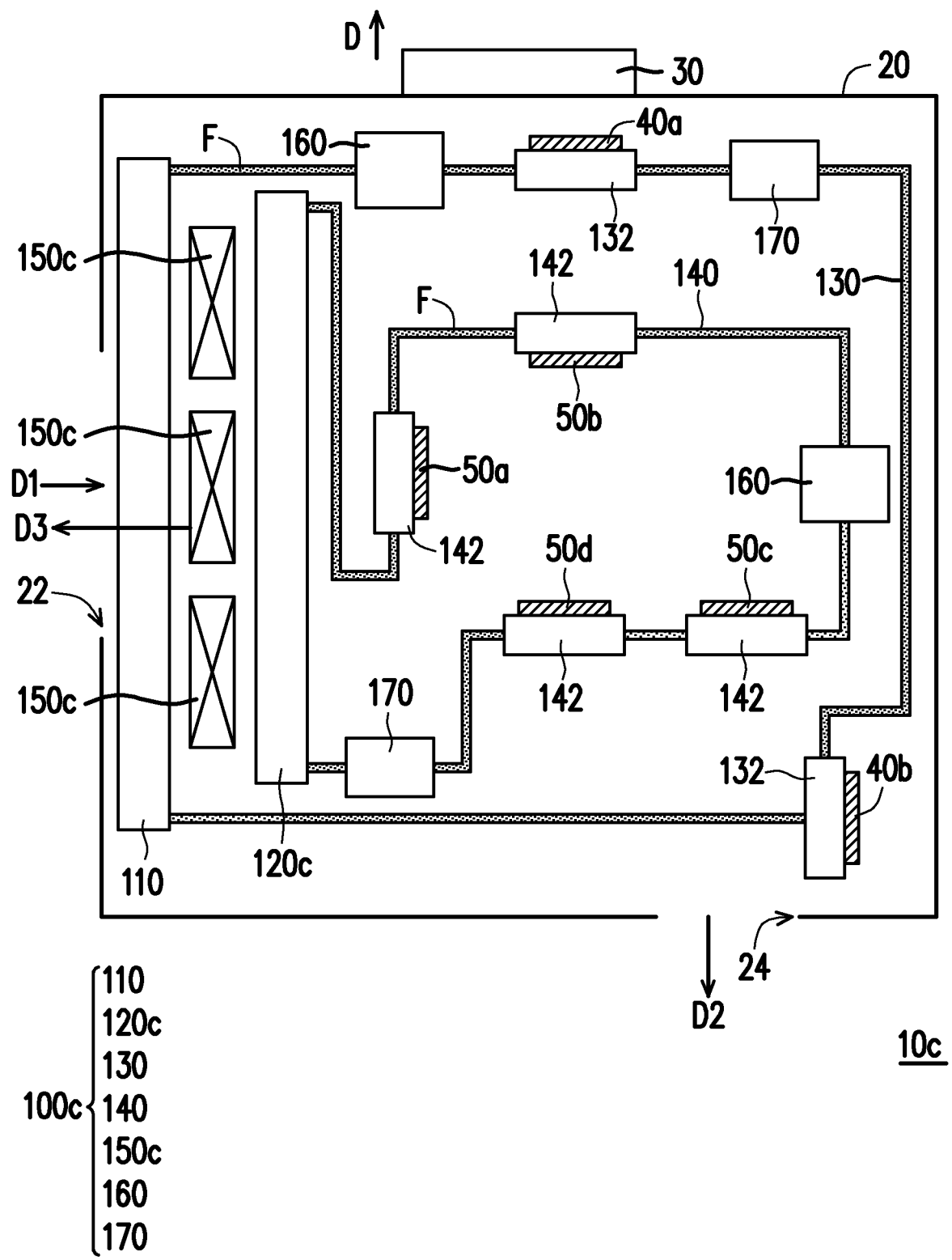
FIG. 3 is a schematic diagram of a projection device according to another embodiment of the invention.

FIG. 3 is a schematic diagram of a projection device according to another embodiment of the invention. Referring to FIG. 1A and FIG. 3 at the same time, the projection device 10c of the embodiment is similar to the projection device 10a of the aforementioned embodiment. A difference between the two projection devices 10a and 10c is that: in the embodiment, the fans 150c of the heat dissipation module 100c generates heat dissipation airflows, and in an airflow direction D3 of the heat dissipation airflows, the first heat sink 110 is arranged upstream of the airflow direction D3 compared to the second heat sink 120c. In addition, compared to the second heat sink 120c, the first heat sink 110 is closer to the air inlet 22; on the contrary, compared to the first heat sink 110, the second radiator 120c is closer to the air outlet 24.

In summary, the embodiments of the invention have at least one of following advantages or effects. In the design of the heat dissipation module of the invention, the first heat sink and the first heat source form the first loop through the first pipe, the second heat sink and the second heat source form the second circuit through the second pipe, and the liquid medium in the pipes flows through the heat sinks for heat exchange and then flows to the heat sources for circulating heat dissipation. In other words, by using two sets of independent liquid cooling loops to respectively dissipate heat of the first heat source and the second heat source with different operating temperatures, the heat dissipation module of the invention may have better heat dissipation efficiency. In addition, the projection device using the heat dissipation module of the invention may have increased heat dissipation area without increasing a number of fans, and may reduce a rotation speed of the fans, thereby reducing system noise.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A heat dissipation module, configured for heat dissipation of at least one first heat source and at least one second heat source of a projection device, and comprising a first heat sink, a second heat sink, a first pipe, and a second pipe, wherein the first heat sink and the at least one first heat source are connected to each other through the first pipe to form a first loop, so that a liquid medium flowing in the first pipe exchanges heat generated from the at least one first heat source and flows through the first heat sink for circulating heat dissipation; and the second heat sink and the at least one second heat source are connected to each other through the second pipe to form a second loop, so that a liquid medium flowing in the second pipe exchanges heat generated from the at least one second heat source and flows through the second heat sink for circulating heat dissipation, wherein the first loop and the second loop are independent of each other, wherein the heat dissipation module meets at least one of following conditions:

a first operating temperature of the at least one first heat source is less than a second operating temperature of the at least one second heat source;

a total heat amount generated by the at least one first heat source is less than a total heat amount generated by the at least one second heat source;

a temperature increase rate of the liquid medium in the first pipe is lower than a temperature increase rate of the liquid medium in the second pipe; and a first temperature of the liquid medium in the first pipe is less than a second temperature of the liquid medium in the second pipe.

2. The heat dissipation module as claimed in claim 1, wherein the first heat sink comprises a plurality of first heat dissipation fins, and in a direction perpendicular to an arrangement direction of first heat dissipation fins, a first area of the first heat sink is smaller than a second area of the second heat sink.

3. The heat dissipation module as claimed in claim 1, wherein the first heat sink comprises a plurality of first heat dissipation fins, and in a direction parallel to an arrangement direction of the first heat dissipation fins, a first length of the first heat sink is greater than a second length of the second heat sink.

4. The heat dissipation module as claimed in claim 1, wherein the first heat sink comprises a plurality of first heat dissipation fins, and in a direction perpendicular to an arrangement direction of the first heat dissipation fins, a first height of the first heat sink is greater than a second height of the second heat sink.

5. The heat dissipation module as claimed in claim 1, wherein the first heat sink comprises a plurality of first heat dissipation fins, the second heat sink comprises a plurality of second heat dissipation fins, and a first gap between the first heat dissipation fins is greater than a second gap between the second heat dissipation fins.

6. The heat dissipation module as claimed in claim 1, further comprising:

at least one fan, generating a heat dissipation airflow, wherein in an airflow direction of the heat dissipation airflow, the first heat sink is arranged upstream of the airflow direction compared to the second heat sink.

7. The heat dissipation module as claimed in claim 1, further comprising:

a driving element, connected to the first pipe or the second pipe, wherein the liquid medium in the first pipe is driven by the driving element to circulate in the first pipe or the liquid medium in the second pipe is driven by the driving element to circulate in the second pipe.

8. The heat dissipation module as claimed in claim 7, further comprising:

a tank, connected to the first pipe or the second pipe to accommodate the liquid medium in the first pipe or the liquid medium in the second pipe, wherein the liquid medium in the tank is driven by the driving element to circulate in the first pipe or the second pipe.

9. The heat dissipation module as claimed in claim 1, wherein at least a part of the first pipe or the second pipe is a heat sink accommodating slot, the at least one first heat source or the at least one second heat source contacts the heat sink accommodating slot, and the liquid medium in the first pipe or the liquid medium in the second pipe flows into the heat sink accommodating slot for heat dissipation.

10. A projection device, comprising a casing, a projection lens, at least one first heat source, at least one second heat source, and a heat dissipation module, wherein the projection lens is disposed through the casing;

the at least one first heat source, the at least one second heat source, and the heat dissipation module are arranged in the casing; and the heat dissipation module comprises a first heat sink, a second heat sink, a first pipe, and a second pipe, wherein the first heat sink and the at least one first heat source are connected to each other through the first pipe to form a first loop, so that a liquid medium flowing in the first pipe exchanges heat generated from the at least one first heat source and flows through the first heat sink for circulating heat dissipation; and the second heat sink and the at least one second heat source are connected to each other through the second pipe to form a second loop, so that a liquid medium flowing in the second pipe exchanges heat generated from the at least one second heat source and flows through the second heat sink for circulating heat dissipation, wherein the first loop and the second loop are independent of each other, wherein the heat dissipation module meets at least one of following conditions:

a first operating temperature of the at least one first heat source is less than a second operating temperature of the at least one second heat source;

a total heat amount generated by the at least one first heat source is less than a total heat amount generated by the at least one second heat source;

a temperature increase rate of the liquid medium in the first pipe is lower than a temperature increase rate of the liquid medium in the second pipe; and a first temperature of the liquid medium in the first pipe is less than a second temperature of the liquid medium in the second pipe.

11. The projection device as claimed in claim 10, wherein the first heat sink comprises a plurality of first heat dissipation fins, and in a direction perpendicular to an arrangement direction of first heat dissipation fins, a first area of the first heat sink is smaller than a second area of the second heat sink.

12. The projection device as claimed in claim 10, wherein the first heat sink comprises a plurality of first heat dissipation fins, and in a direction parallel to an arrangement direction of the first heat dissipation fins, a first length of the first heat sink is greater than a second length of the second heat sink.

13. The projection device as claimed in claim 10, wherein the first heat sink comprises a plurality of first heat dissipation fins, and in a direction perpendicular to an arrangement direction of the first heat dissipation fins, a first height of the first heat sink is greater than a second height of the second heat sink.

14. The projection device as claimed in claim 10, wherein the first heat sink comprises a plurality of first heat dissipation fins, the second heat sink comprises a plurality of second heat dissipation fins, and a first gap between the first heat dissipation fins is greater than a second gap between the second heat dissipation fins.

15. The projection device as claimed in claim 10, wherein the heat dissipation module further comprising:
at least one fan, generating a heat dissipation airflow, wherein in an airflow direction of the heat dissipation airflow, the first heat sink is arranged upstream of the airflow direction compared to the second heat sink.

16. The projection device as claimed in claim 10, wherein the heat dissipation module further comprising:
a driving element, connected to the first pipe or the second pipe, wherein the liquid medium in the first pipe is driven by the driving element to circulate in the first pipe or the liquid medium in the second pipe is driven by the driving element to circulate in the second pipe.

17. The projection device as claimed in claim 16, wherein the heat dissipation module further comprising:
a tank, connected to the first pipe or the second pipe to accommodate the liquid medium in the first pipe or the liquid medium in the second pipe, wherein the liquid medium in the tank is driven by the driving element to circulate in the first pipe or the second pipe.

18. The projection device as claimed in claim 10, wherein at least a part of the first pipe or the second pipe is a heat sink accommodating slot, the at least one first heat source or the at least one second heat source contacts the heat sink accommodating slot, and the liquid medium in the first pipe or the liquid medium in the second pipe flows into the heat sink accommodating slot for heat dissipation.

* * * * *